(12) United States Patent
Sung et al.

(10) Patent No.: US 7,046,522 B2
(45) Date of Patent: May 16, 2006

(54) METHOD FOR SCALABLE ARCHITECTURES IN STACKABLE THREE-DIMENSIONAL INTEGRATED CIRCUITS AND ELECTRONICS

(76) Inventors: Raymond Jit-Hung Sung, 7212 Avalon Dr., Wilmington, MA (US) 01887; Tyler Lee Brandon, 205 Kingfisher Bay, Sherwood Park, AB (CA) T8A 3M1; John Conrad Koob, 11135-83 Ave. #910, Edmonton, AB (CA) T6G 2C6; Duncan George Elliott, Department of Electrical and Computer Engineering, University of Alberta, Edmonton, AB (CA) T6G 2V4; Daniel Arie Leder, #3 51524 RR 271, Spruce Grove, AB (CA) T7Y 1G9

( * ) Notice: Subject to any disclaimer, the term of this patent is extended or adjusted under 35 U.S.C. 154(b) by 363 days.

(21) Appl. No.: 10/391,781

(22) Filed: Mar. 20, 2003

(65) Prior Publication Data

US 2003/0178228 A1   Sep. 25, 2003

Related U.S. Application Data

(60) Provisional application No. 60/365,807, filed on Mar. 21, 2002.

(51) Int. Cl.
*H05K 1/11* (2006.01)
*H01L 23/52* (2006.01)
*H01L 23/535* (2006.01)

(52) U.S. Cl. ............ 361/803; 257/686; 257/698; 257/724; 257/777; 438/109; 174/262

(58) Field of Classification Search ............ 257/686, 257/698, 723, 724, 777; 174/262; 361/803; 438/109
See application file for complete search history.

(56) References Cited

U.S. PATENT DOCUMENTS

| | | | | |
|---|---|---|---|---|
| 3,400,210 A | * | 9/1968 | Reimer | 174/266 |
| 5,130,894 A | * | 7/1992 | Miller | 361/735 |
| 5,434,745 A | * | 7/1995 | Shokrgozar et al. | 361/735 |
| 5,585,675 A | * | 12/1996 | Knopf | 257/774 |
| 5,612,570 A | * | 3/1997 | Eide et al. | 257/686 |
| 5,946,553 A | * | 8/1999 | Wood et al. | 438/108 |
| 5,995,379 A | * | 11/1999 | Kyougoku et al. | 361/803 |
| 6,239,496 B1 | * | 5/2001 | Asada | 257/777 |
| 6,271,587 B1 | * | 8/2001 | Patti | 257/724 |
| 6,376,904 B1 | * | 4/2002 | Haba et al. | 257/686 |
| 6,392,292 B1 | * | 5/2002 | Morishita | 257/686 |
| 6,469,375 B1 | * | 10/2002 | Beausoleil et al. | 257/686 |
| 6,611,052 B1 | * | 8/2003 | Poo et al. | 257/686 |

(Continued)

FOREIGN PATENT DOCUMENTS

JP     06-342874 A   *   12/1994

OTHER PUBLICATIONS

Definition of "wafer" on the Web (GOOGLE): en.wikipedia.org/wiki/wafer_(electronics).*

*Primary Examiner*—John B. Vigushin

(57) ABSTRACT

The design methods described enable three-dimensional integrated circuit systems in which all of the dies, in a vertically bonded stack of dies, are identical. Only one mask set and wafer type is required since a single circuit design is produced for one die in the stack and reused for all the dies with little or no modification. The system scales directly as the level of stacking is increased while incurring no extra design effort, beyond that required for the initial design.

68 Claims, 10 Drawing Sheets

U.S. PATENT DOCUMENTS 6,621,155 B1 * 9/2003 Perino et al. ................ 257/686
6,740,981 B1 * 5/2004 Hosomi ...................... 257/778
6,768,208 B1 * 7/2004 Lin et al. .................... 257/777
6,873,035 B1 * 3/2005 Watanabe et al. ........... 257/686

* cited by examiner

METHOD FOR SCALABLE ARCHITECTURES IN STACKABLE THREE-DIMENSIONAL INTEGRATED CIRCUITS AND ELECTRONICS

This application claims priority from U.S. Application No. 60/365,807 file Mar. 21, 2002.

FIELD OF THE INVENTION

Scalable electronic circuit system composed of stacked layers of the same or similar circuitry.

BACKGROUND OF THE INVENTION

Traditionally integrated circuits have been built in a planar fashion, with a single layer of transistors. New developments in manufacturing process technology allow wafers to be vertically stacked and fine-grained vertical conductors formed between circuits on adjacent dies [1, 2, 3, 4, 5, 6, 7]; U.S. Pat. No. 5,627,106; U.S. Pat. No. 5,877,034; U.S. Pat. No. 5,998,808; U.S. Pat. No. 6,185,122; U.S. Pat. No. 6,034,882. Alternatively, layers of transistor circuits may be interconnected with coarser grain conductors such as coaxial lines, (C-4) solder pads, solder mounds, solder bumps, wire bounds, wire interconnects or embedded wiring as in U.S. Patent Application No. 20010033030; U.S. Patent Application No. 20010033509; U.S. Patent Aapplication No. 20010005059; U.S. Pat. No. 5,495,397; U.S. Pat. No. 5,544,017; U.S. Pat. No. 5,778,529.

It can be useful for each die in a three-dimensional stack of dies to serve a unique purpose. Previous designs implemented in vertically stacked integrated circuit processes used individual mask layouts for each die in the stack [1, 5, 3, 4]; U.S. Pat. No. 5,998,808; U.S. Pat. No. 5,138,437. While extending these circuits to three-dimensions has the effect of reducing global interconnect length, they do little to alleviate the design effort and mask costs associated with each die.

Recent innovations in three-dimensional memories stack separate layers of memory cells on top of a layer of peripheral circuits [7]; U.S. Pat. No. 6,185,122; U.S. Pat. No. 6,034,882; U.S. Pat. No. 5,487,031; U.S. Pat. No. 5,375,085. However, in these designs, both the memory cell layers and the peripheral circuits must be present to provide random access data storage thus requiring at least two sets of layout masks. Furthermore, the three-dimensional techniques described do not apply to digital logic or digital logic coupled with memories.

Die stacking has the potential to increase processing power, chip integration, operating speed and data storage density in the same planar area while minimizing global interconnect lengths. Reducing the stacking interval (distance between adjacent dies) in these technologies reduces wire lengths even further, resulting in reduced power consumption and increased logic speed. However, self-heating effects, alignment issues and circuit yield impose limits on the stack height. As designs move to three dimensions, new design techniques are required to maximize performance while minimizing design effort.

OTHER REFERENCES

[1] J. A. Burns et al., "Three-dimensional integrated circuits for low-power, high-bandwidth systems on a chip", in Proc. IEEE Intl. Solid-State Circuits Conf., pp. 268–269, 453, February 2001.

[2] J. A. Burns et al., "3D circuit integration technology for multiproject fabrication", MIT Lincoln Laboratory, May 2001, DARPA PI Meeting.

[3] Y. Akasaka, "Three-dimensional IC trends", Proc. of the IEEE, vol. 74, n. 12, pp. 1703–1714, December 1986.

[4] K. Banerjee, S. J. Souri, P. Kapur and K. C. Saraswat, "3-D ICs: A novel chip design for improving deep-submicrometer interconnect performance and systems-on-chip integration", Proc. of the IEEE, vol. 89, n. 5, pp. 602–633, May 2001.

TABLE 1

U.S. Patent Documents

| Patent No. | Inventor | Date |
| --- | --- | --- |
| 20010033509 | Ahn, Kie Y. et al. | Oct. 25, 2001 |
| 20010033030 | Leedy, Glenn J. | Oct. 25, 2001 |
| 6,185,122 | Johnson, et al. | Feb. 6, 2001 |
| 6,034,882 | Johnson, et al. | Mar. 7, 2000 |
| 20010005059 | Koyanagi, Mitsumasa; et al. | Jun. 28, 2001 |
| 5,998,808 | Matsushita | Dec. 7, 1999 |
| 5,138,437 | Kumamoto | Aug. 11, 1992 |
| 5,375,085 | Gnade, et al. | Dec. 20, 1994 |
| 5,487,031 | Gnade, et al. | Jan. 23, 1996 |
| 5,495,397 | Davidson, et al. | Feb. 27, 1996 |
| 5,877,034 | Ramm, et al. | Mar. 2, 1999 |
| 5,778,529 | Beilin, et al. | Jul. 14, 1998 |
| 5,627,106 | Hsu | May 6, 1997 |
| 5,544,017 | Beilin, et al. | Aug. 6, 1996 |

[5] K. Kioi et al., "Design and implementation of a 3D-LSI image sensing processor", IEEE J. Solid-State Circuits, vol. 27, n. 8, pp. 1130–1140, Aug. 1992.

[6] V. W. C. Chan, P. C. H. Chan and M. Chan, "Multiple layers of CMOS integrated circuits using recrysrallized silicon film", IEEE Electron Device Letters, vol. 22, n. 2, pp. 77–79, February 2001.

[7] T. H. Lee, "A vertical leap for microchips", Scientific American, pp. 52–59, January 2002.

BRIEF SUMMARY OF THE INVENTION

An object of this invention is to provide a method to reuse the same or similar integrated circuit design for each die in a vertically bonded stack of dies, and have the entire stack of dies function as an interconnected system.

It is a further object of this invention to provide such a method for arranging vertical conductors and terminators for coupling electrical signals between adjacent dies in the stack.

It is a further object of this invention to provide such a method for offsetting dies for coupling electrical signals between adjacent dies in the stack.

In light of the fact that electrical signals can communicate among others: data information, control information, addressing information; it is an object of this invention to provide such a method for communicating externally to, externally from or communicating between, dies in the stack.

It is a further object of this invention to provide such a method for identifying the top die to define a communications boundary in a vertical stack of like dies.

It is a further object of this invention to provide such a method for identifying the bottom die to define a communications boundary in a vertical stack of like dies.

It is a further object of this invention to provide such a method for broadcasting electrical signals to all dies in a vertical stack of like dies.

It is a further object of this invention to provide such a method for assigning each die, in a vertical stack of like dies, a unique address.

It is a further object of this invention to provide such a method for addressing one die in a vertical stack like of dies.

It is a further object of this invention to provide such a method for communicating between storage elements on one die to the next storage elements on an adjacent die.

The methods described enable scalable integrated circuit systems in which circuits on different die, in a vertical three-dimensional stack of dies, are identical. Only one mask set is required for the entire stack. The system scales directly as the level of stacking is increased while incurring no extra design effort as the stack height increases.

BRIEF DESCRIPTION OF THE DRAWINGS

The invention will now be described in more detail, by way of example only, with reference to the accompanying drawings.

The manner of accomplishment of these objectives and the presence or other advantages of the present invention will become apparent as the description proceeds with references to the drawings in which.

Figure 1:
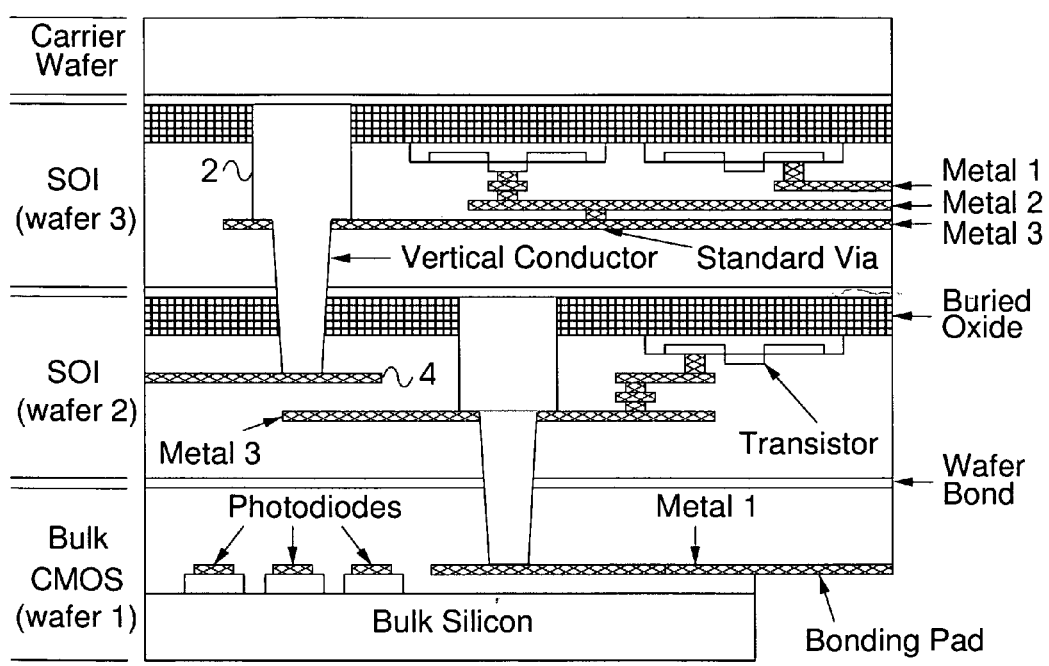
FIG. 1 is a cross section of a stack of dies using MIT Lincoln Laboratory's 3D Fully-Depleted Silicon-On-Insulator technology. This figure shows the orientation of an interdie-connector relative to the dies and associated transistor layers.

While the patent invention shall now be described with reference to the preferred embodiments shown in the drawings, it should be understood that the intention is not to limit the invention only to the particular embodiments shown but rather to cover all alterations, modifications and equivalent arrangements possible within the scope of appended claims.

DETAILED DESCRIPTION OF THE INVENTION

The preferred embodiments of the present invention are illustrated in FIGS. 1 through 6 of the drawings like numerals being used to refer to like and corresponding parts of the various drawings.

The present invention involves design techniques or methods that enable scalable integrated circuit systems. A single design and mask set is produced for one die, within a vertical three-dimensional stack of dies, and is reused for all dies with little or no design modification.

The system scales directly as the levels of stacking is increased while incurring no extra design effort as the stack height increases. Furthermore, the presented methods simplifies design verification since only a single layer of circuits needs to be verified instead of multiple layers.

Thus, the presented methods increase processing power, chip integration and data storage density in the same planar integrated circuit area with small additional design effort for the single design that is reused for all dies in the stack. These methods will significantly reduce the performance/productivity gap inherent with shrinking device geometries and increased system-on-chip integration.

Vertical conductors or interdie vias 2 are conductors that allow signals on adjacent dies to be coupled together. In the 3D process developed by MIT Lincoln Laboratory based on their 0.18-μm fully-depleted silicon-on-insulator technology, a compact 2.5-μm vertical conductor 2 connects the top metal (M3) of the current die to bottom metal (M1) of the die above as in FIG. 1. In this technology, design rules do not permit vertical conductors 2 to be directly stacked. In all figures except FIG. 1, the top metal M3 is shown on top and the vertical conductors 2 are shown going upwards. The stacking interval, or distance between adjacent stack levels, is approximately 6.0 μm and stack levels are separated by an insulator. Although the connectors and circuits described pertain directly to this technology, the design techniques presented in this invention can be adapted to any stackable integrated circuit technology that allows vertical interconnections between adjacent dies.

Figure 2:
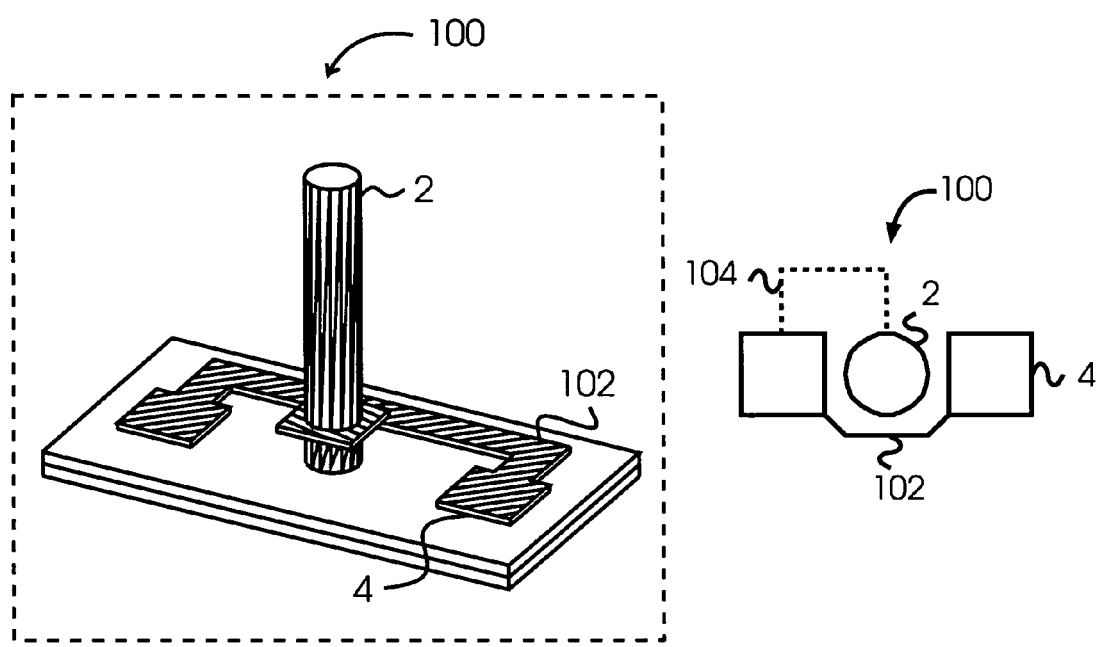
FIG. 2 illustrates a single die connector with two 3D via pads spaced equidistant on both sides of the 3D via conductor. It also shows the circuit symbol used to denote the die connector.
Figure 3:
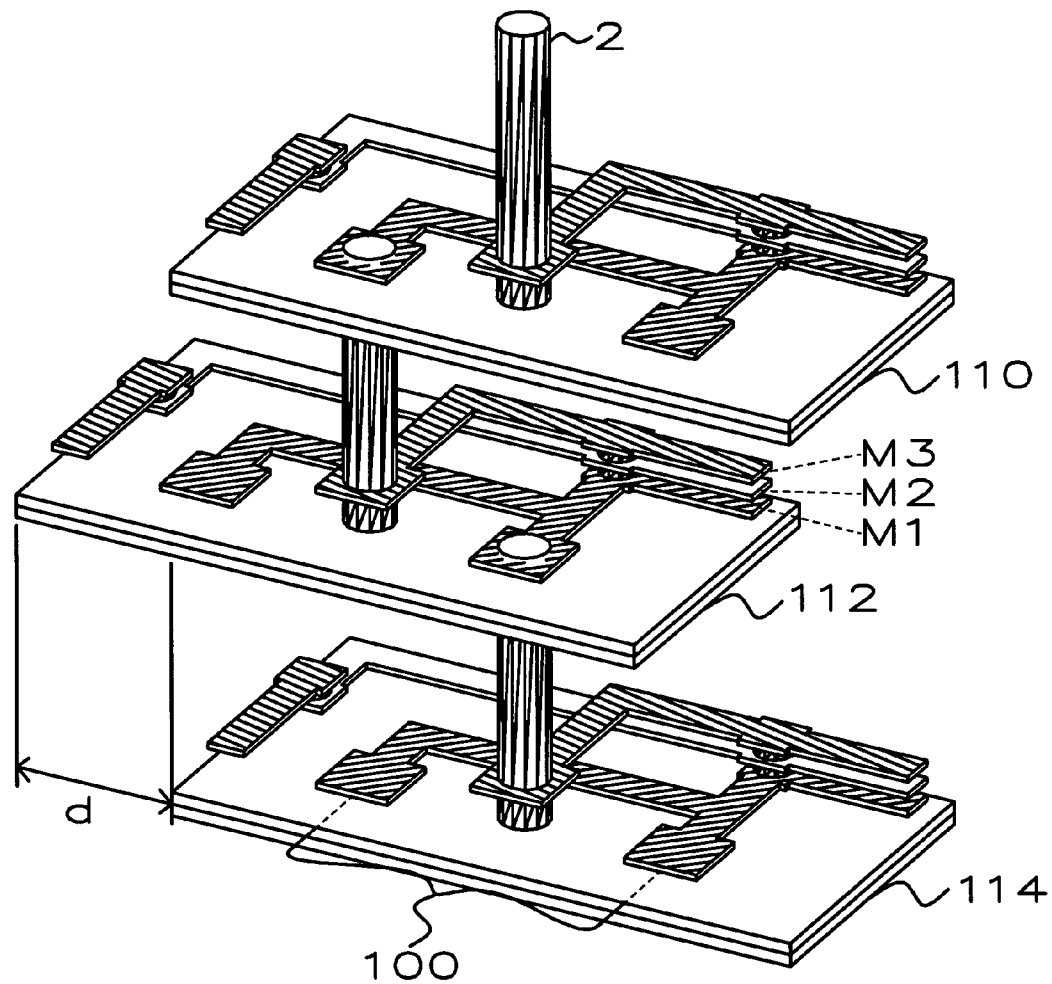
FIG. 3 illustrates how the die connector can be used to form connections between dies, where alternating dies are offset by the distance, d, between the 3D via conductor and 3D via pads. It also demonstrates the arrangement and connection of 3D via and 3D via pads for broadcasting a signal to all dies.
Figure 4:
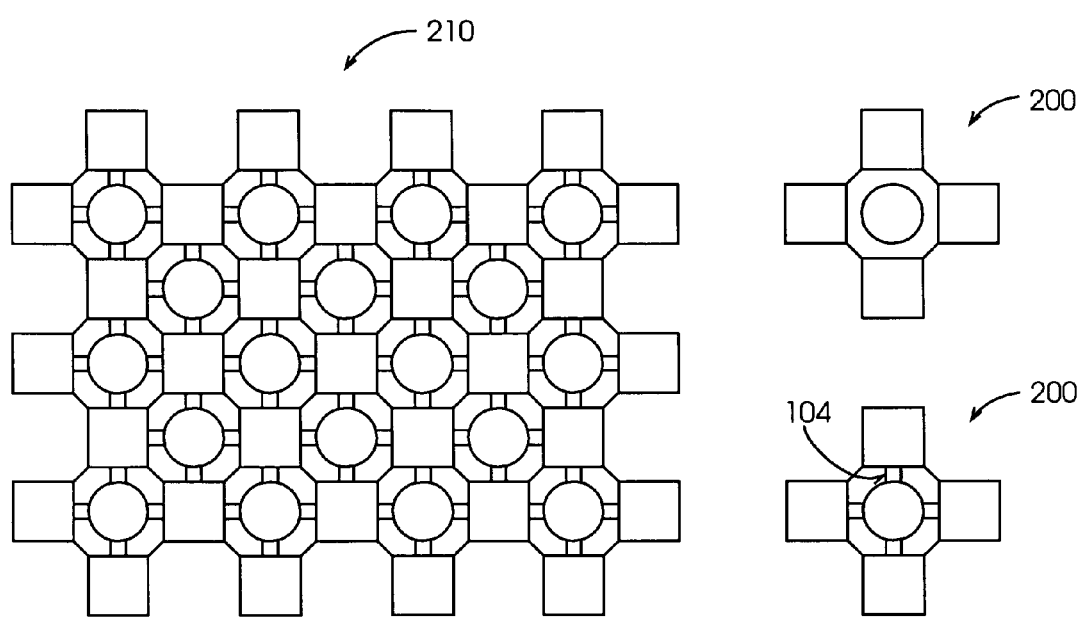
FIG. 4 illustrates a die connector array and modified die connectors.

Stacked die architectures that use a repeated design require bi-directional vertical conductors 2 coupled with terminators 4 for those conductors. This structure, or connector 100, consists of a vertical conductor 2 situated equally between two terminators 4 as shown in FIG. 2. An electrical connection 102 can exist between each terminator 4. The conditional connection 104 between the vertical conductor 2 and terminators 4 on the local die is key for implementing various inter-die communication networks. Consider three stacked dies 110, 112, 114 with the connectors 100 aligned, as shown in FIG. 3. Note how the vertical conductor 2 on the middle die 112 aligns with the left terminator 4 of the connector 100 on the die above it 110. This staggered alignment of alternating dies facilitates the connection of signals from the current die to the die above, the die below or both dies. With one mask set and wafer type the wafers are aligned with the necessary offset, d, and then fused together.

An extension 200 of the connector structure 100 consists of four terminators 4 placed symmetrically around a vertical conductor 2 with an optional connection 104. This structure 200 can be used as elements in an array 210 as in FIG. 4. This facilitates inter-die routing of standard cells which do not have a preferred or fixed orientation and whose orientation could be changed by the computer-aided-design tools used for placement and routing. Furthermore, I/O cells and I/O pads, which may have to be rotated in 90° increments in the I/O pad ring, can use the connector array 210. This is because the connector array 210 can be rotated in 90° increments and maintain same signal connectivity between two adjacent dies.

Figure 5:
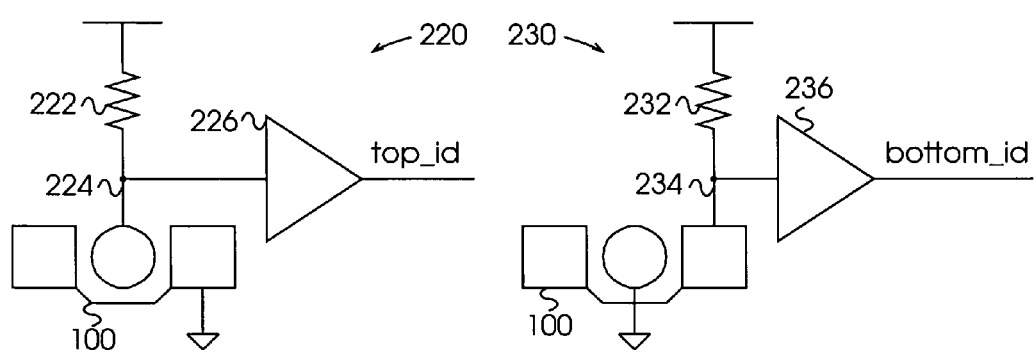
FIG. 5 illustrates passive top and bottom die identifier circuits that are present on all dies in the vertical stack of dies.
Figure 6:
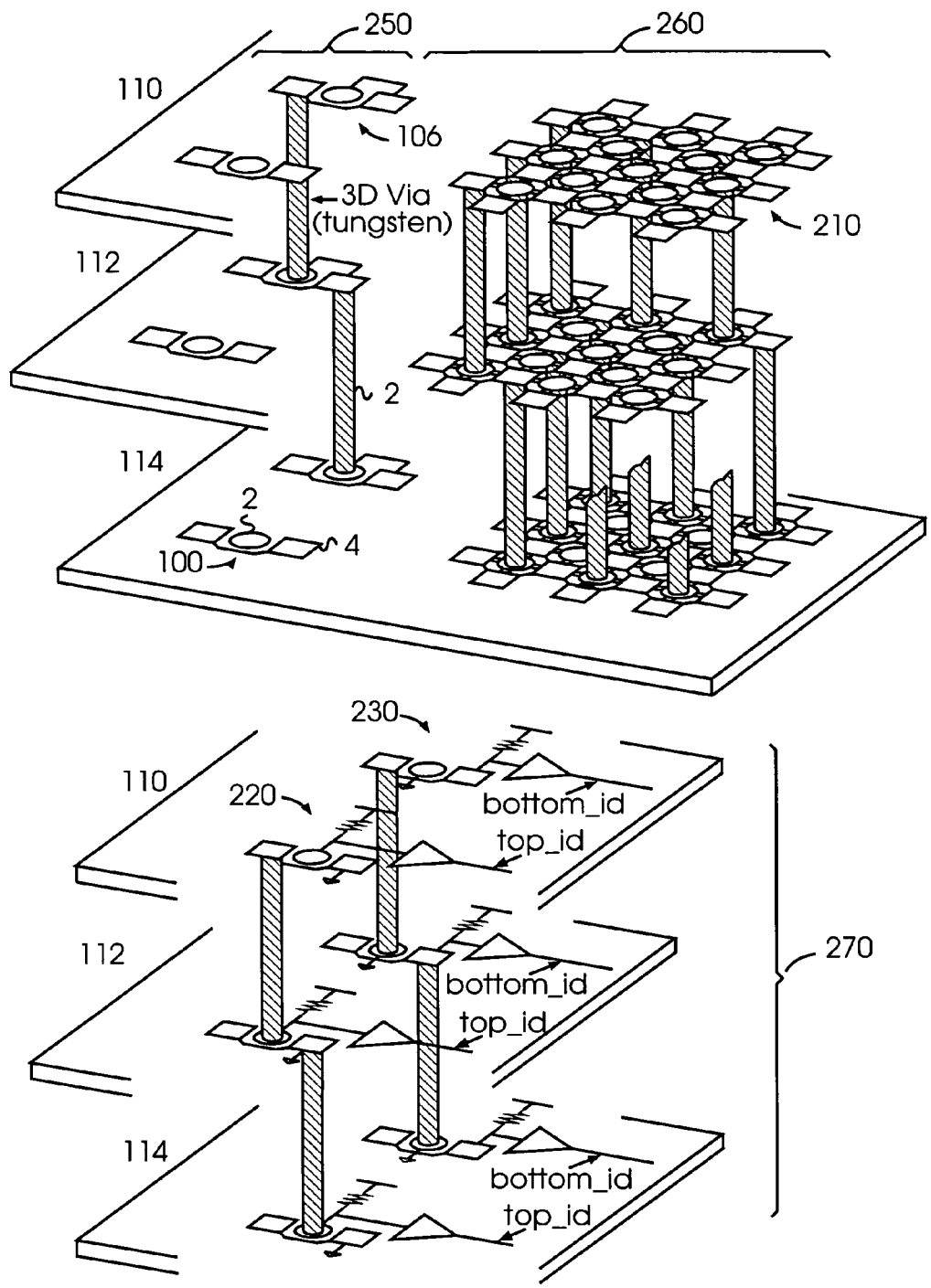
FIG. 6 presents various inter-die structures useful for signals, global clocks and power routing. Also shown are the circuits used to identify the top and bottom dies in the stack.

Communication networks implemented among adjacent stacked dies need to identify the boundaries of the stack. Identifying whether a die is at the top or bottom of the stack is important when redirecting the flow of information at that boundary. For example, a connector 100 configured to pass data to a lower die should only do so if that die exists. As shown in FIGS. 5 and 6, extreme detectors 220, 230 uniquely identify the top die 110 and bottom die 114. Furthermore, top self-identifier circuit 220 and bottom die self-identifier circuit 230 remove the need for external die identifier signals. One implementation of a top die identifying circuit 220 consists of a connector 100 where the terminators 4 are grounded and the vertical conductor 2 is coupled to a weak pull-up device 222, as shown in FIG. 5. The node 224 connected to the weak pull-up device 222 is amplified by a buffer 226 to provide the top_id for the current die. A similar circuit 230 is constructed to identify the bottom die. Thus any die below another die will have its identifier signal grounded, while the top die's identifier signal is pulled high. For example, in the die identification circuit group 270 in FIG. 6, die 110 will have its top identifier signal top_id asserted and die 114 will have its bottom identifier signal bottom_id asserted. All other top_id and bottom_id signals will remain unasserted. The static power consumed by this self-identifying scheme is very small (in the order of tens of μW per circuit layer). Other implementations of die identifier circuits exist which do not consume static power. These identifier circuits use custom or standard cell library storage elements instead of resistors. However, they require an external control signal.

A broadcasting circuit 250 sends a signal to all dies within the stack. Examples of broadcast signals include global clocks, addresses, and control signals. A connector 100 with the vertical conductor 2 coupled 104 to its terminators 4 will implement broadcasting, as in FIGS. 3 and 6. All metal layers in FIG. 3 are assumed to be connected with regular vias. A connector array 210 provides a high-density, low-resistance, high current carrying connection 260 and is suitable for routing fixed-potentials between dies.

Figure 7:
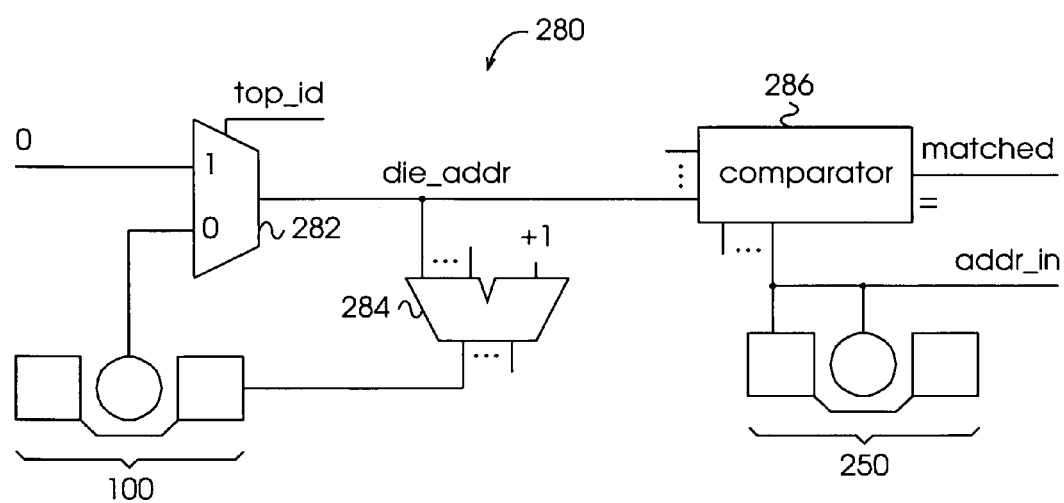
FIG. 7 illustrates circuits to address one die in a vertical stack of dies.
Figure 9:
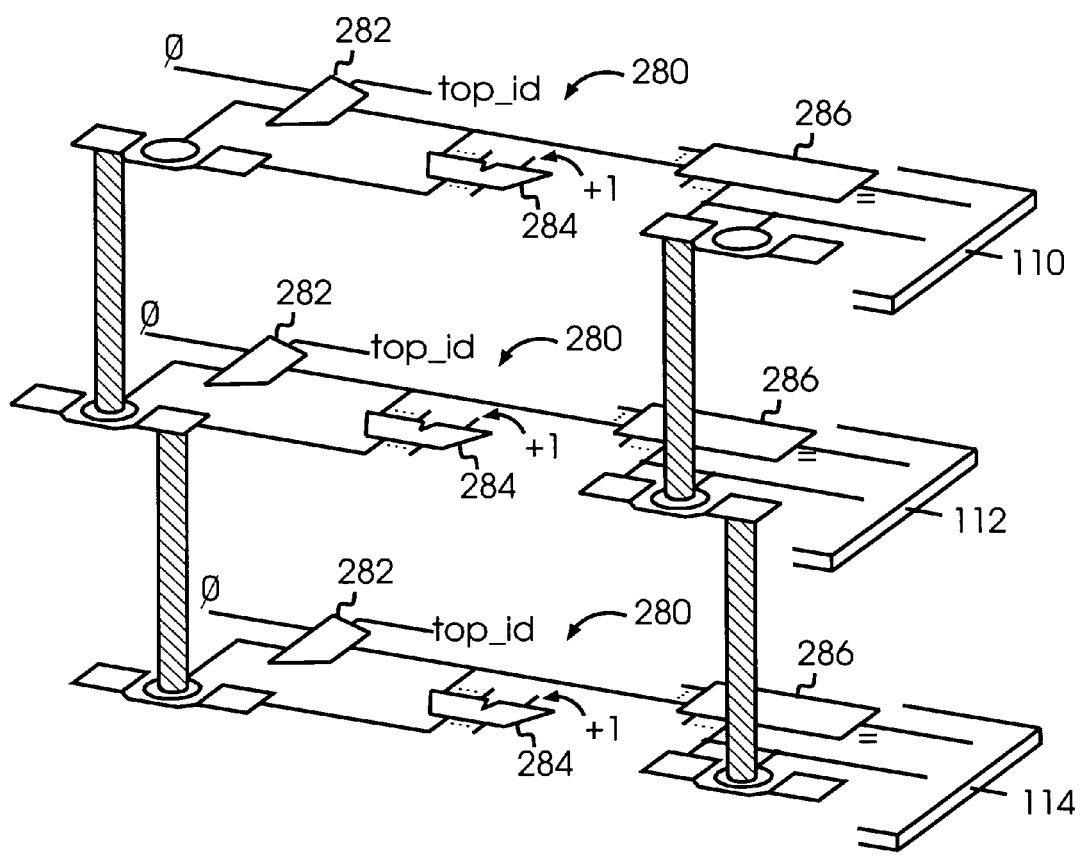
FIG. 9 shows how the circuit in FIG. 7 appears in a stack of identical dies.

Die addressing is the means by which one die is selected within the stack. The die addressing circuit 280, shown in FIG. 7, uses the top die identifier signal top_id from the top die indentifier circuit 220. The top_id signal is used as the select line for the 2-1 multiplexor 282. Individual dies can be assigned unique addresses relative to the top die or bottom die in the stack. If top_id is asserted, the die_addr signal will be zero. Otherwise, die_addr will be equal to the output of the adder 284 that is present on the die above. A comparator 286 compares the die_addr signal with the addr_in signal that is broadcasted to all dies with the broadcasting circuit 250. FIG. 9 is an example of a stack of three dies where the top die 110 has a die_addr of 0, the middle die 112 has a die_addr of 1, and the bottom die 114 has a die_addr of 2. In general, this describes a method of assigning die addresses where the top die sets its address to zero, increments the address by one and passes it down. The next die, because it is not the top die, will make the passed-in address its own, then increment it and pass it down. A die will respond when the input broadcast address addr_in matches the die address die_addr. Die addresses are pre-computed allowing the input address to be immediately driven for faster address resolution.

Figure 8:
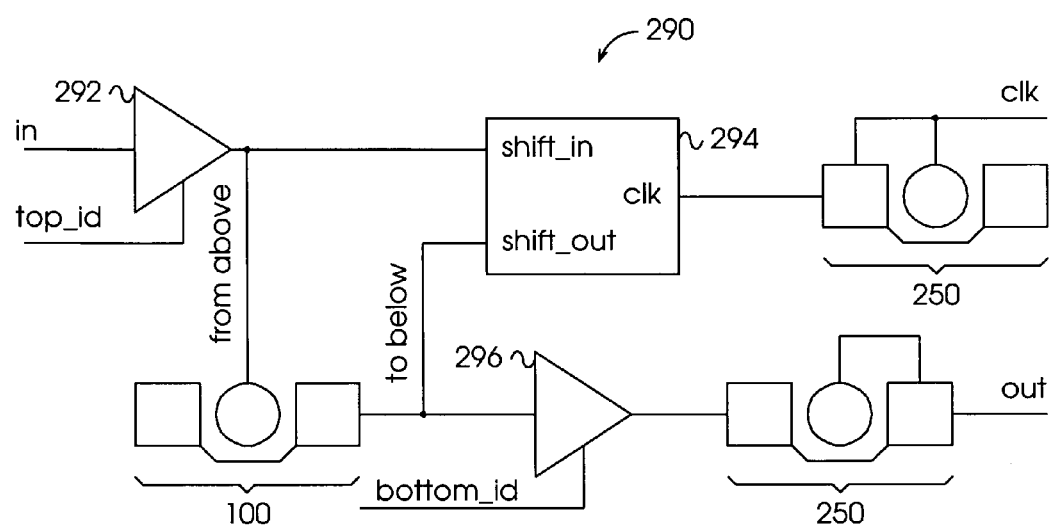
FIG. 8 illustrates a one-bit slice of an interdie communications chain that communicates data between storage elements on adjacent dies.
Figure 10:
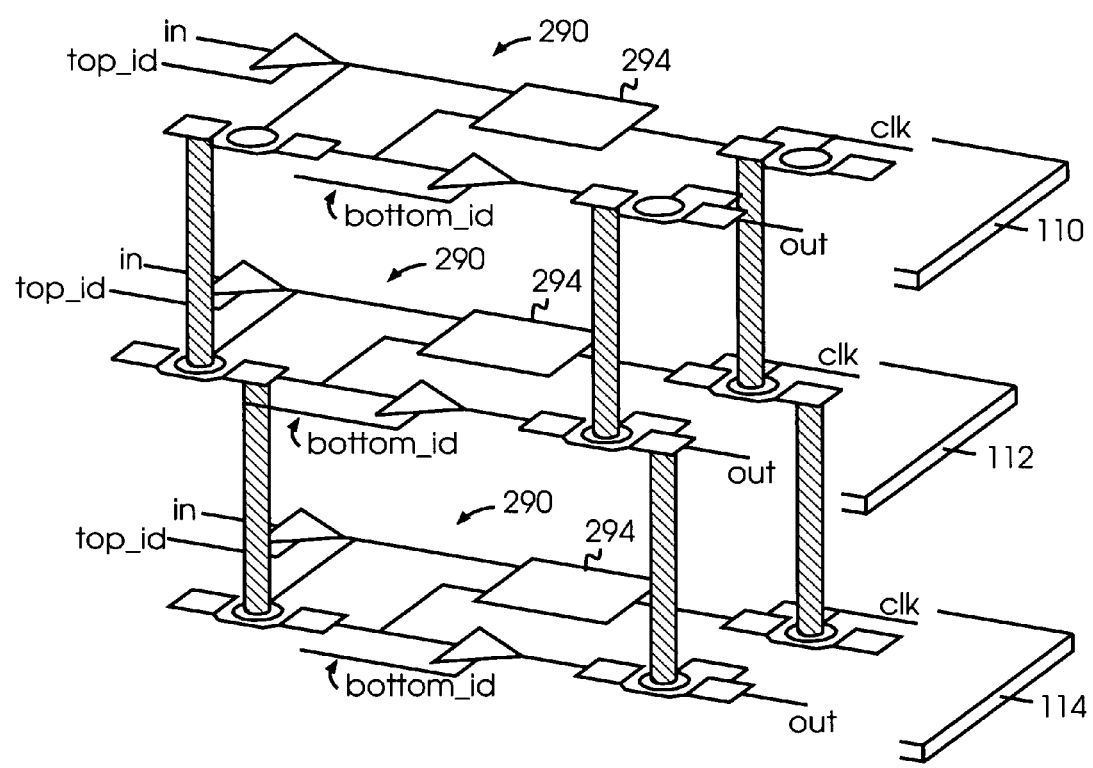
FIG. 10 shows how the circuit in FIG. 8 appears in a stack of identical dies.

Communication between multiple dies can be accomplished by an inter-die network as shown in FIGS. 8 and 10. Redirection of data within these networks relies upon the identification of both the top die 110 and bottom die 114 in the stack, to prevent data from flowing past the stack boundaries. Inter-die networks can be used to implement scan chains 290, inter-processor communication or pipelined computation where information is passed from latches or registers 294 on one level of the stack to latches or registers on another level of the stack. Register 294 is clocked by a global signal clk that is broadcasted using a broadcast circuit 250. FIG. 8 shows a one-bit slice of an inter-die scan chain 290. FIG. 10 is an example of a inter-die scan chain 290 across three dies 110, 112 and 114. On the top die 110, shift_in is coupled to in (an external signal) through a tristate buffer 292. This tristate buffer 292 is controlled by the result (top_id) of the top die identifier circuit 220. The shift_out signal is coupled to the die below 112 through a connector 100. For the die in the middle 112, shift_in is coupled to the die above 110 through the connector 100 and shift_out is coupled to the die below 114 through the connector 100. On the bottom die 114, shift_in is coupled to the die above 112 through the connector 100 and shift_out is coupled by a tristate buffer 296 to a broadcasting circuit 250 that conveys the data to the top of the stack 110 and then to a location external to the stack. The tristate buffer 296 is controlled by the bottom_id signal generated by the bottom die identifier circuit 230.

Thus three-dimensional methods and circuits for using a single design for all dies in vertical stack of dies has been presented.

ENHANCEMENTS

The present invention can be adapted to any stackable integrated circuit technology that allows unrestricted or restricted vertical interconnections between adjacent dies.

Although the present invention pertains to stacked integrated circuits, the method of aligning and connecting together like wafers can be applied to: stacked multi-chip modules, stacked printed circuit boards, three-dimensional systems packaging, stacked system modules, stacked circuit subassemblies or any other stacked three-dimensional array of electronic circuitry where like electronic circuitry is used for each level of the stack.

OTHER EMBODIMENTS

From the foregoing description, it will thus be evident that the present invention provides a design method for scalable three-dimensional integrated circuit systems that use a single circuit design, for all dies, in a vertical stack of dies. As various changes can be made in the above embodiments and operating methods without departing from the spirit or scope of the following claims, it is intended that all matter contained in the above description or shown in the accompanying drawings should be interpreted as illustrative and not in a limiting sense.

The embodiments of the invention in which we claim an exclusive property or privilege are defined as follows:

1. An apparatus comprised of stacked layers of electronic circuitry where the electronic circuitry on each layer is identical and adjacent layers are staggered in alternate directions to facilitate electrical interconnection between layers; and where the layers are comprised of a plurality of printed circuit boards or a plurality of semiconductor substrates upon which electronic circuits are constructed; and where the electronic circuitry is comprised of integrated circuits or discrete passive and active electronic components.

2. The apparatus of claim 1 where the stacked layers are comprised of system modules and are electrically interconnected by micro bump bonding of coaxial lines that extend through the thickness of the various semiconductor dies.

3. The apparatus of claim 1 where each layer is comprised of a plurality of subassemblies and where each subassembly is formed from a semiconductor substrate which has on at least one side thereof at least one integrated circuit device.

4. The apparatus of claim 1 where the layers are comprised of multichip module substrates.

5. The multichip module substrates of claim 4 where the substrate comprises a thin film structure, for routing signals to and from integrated circuit chips, formed over a rigid support base.

6. The thin film structures of claim 5 where signals on adjacent multichip module substrates are electrically interconnected through vias formed through apertures that extend through the thickness of the thin film structure and the rigid support base.

7. A connector for coupling together electrical signals on adjacent stacked layers of electronic circuitry comprising:
a vertical conductor centered between two electrically-connected terminators with the vertical conductor equidistant from both terminators;
the said conductive terminators are offset from the vertical conductor whereby one of the said terminators electrically couples to a vertical conductor on an adjacent layer.

8. A vertical conductor of claim 7 where the vertical conductors are interdie vias formed through the thickness of a wafer.

9. A connector of claim 7 where the vertical conductors are coaxial lines that extend through the thickness of the various semiconductor dies and where the terminators are micro bumps on the semiconductor dies that can be bonded to coaxial lines.

10. A connector of claim 7 where the vertical conductors are interconnection members such as solder mounds, wire bonds, or embedded wiring and where the terminators are contact locations that can couple to solder mounds, wire bonds, or embedded wiring.

11. An apparatus where adjacent layers of electronic circuitry are staggered in alternate directions by the distance between a vertical conductor and a terminator of claim 7;
and where each staggered alignment is in a direction from the vertical conductors towards one of the terminators;
and where adjacent layers in the stack are thus staggered in alternate directions so that each vertical conductor is aligned with a terminator on the adjacent layer;
and where the staggered alignment is only constrained by the coupling of vertical conductors and terminators between adjacent layers.

12. A boundary detector for uniquely identifying the boundary layers in a stack of electronic circuitry layers that use the connector in claim 7
where the boundary layers are the extreme layers of the stack of layers and where the boundary layers are identified by an assert or no assert of an electrical signal;
and where each boundary detection circuit is implemented identically on each layer.

13. A passive first boundary layer detector of claim 12 requiring no external control signals, comprising:
a connector of claim 7;
a resistor;
the terminators are coupled to a first fixed potential;
the vertical conductors are coupled to the first terminal of the resistor;
the second terminal of the resistor is coupled to a second fixed potential;
where the first terminal of the resistor is the output of the boundary detector and is asserted to the second fixed potential if the layer is the first boundary layer and is asserted to the first fixed potential otherwise.

14. An active first boundary layer detector of claim 12 that does not dissipate static power and requires one external control signal, comprising:
a connector of claim 7;
a 1-bit memory storage element with an output that tracks the value of its input when the clock is asserted and holds the previous value of the input otherwise;
where the terminators are coupled to a first fixed potential;
the vertical conductors are coupled to the input of the storage element;
the output of the storage element is coupled to the input of the storage element;
the clock input is asserted at all times;
where the storage element contains a control port that unconditionally toggles the output of the storage element to a second fixed potential;
where the output of the storage element is the output of the boundary detector and is asserted to the second fixed potential if the layer is the first boundary layer and is asserted to the first fixed potential otherwise.

15. A passive second boundary layer detector of claim 12 requiring no external control signals, comprising:
a connector of claim 7;
a resistor;
the terminators are coupled to each other and to the first terminal of the resistor;
the vertical conductor is coupled to a fixed first potential;
the second terminal of the resistor is coupled to a second fixed potential;
where the first terminal of the resistor is the output of the boundary detector and is asserted to the second fixed potential if the layer is the second boundary layer and is asserted to the first fixed potential otherwise.

16. A resistor of claims 13 or claim 15 where the resistor is an always on weak drive transistor of wide channel length.

17. An active second boundary layer detector of claim 12 that does not dissipate static power and requires one external control signal, comprising:
a connector of claim 7;
a 1-bit memory storage element with an output that tracks the value of its input when the clock is asserted and holds the previous value of the input otherwise;
where the terminators are coupled to each other and to the input of the storage element;
the vertical conductor is coupled to a first fixed potential;
the output of the storage element is coupled to the input of the storage element;
the clock input is asserted at all times;
where the storage element contains a control port that unconditionally toggles the output of the storage element to a second fixed potential;
where the output of the storage element is the output of the boundary detector and is asserted to the second fixed potential if the layer is the second boundary layer and is asserted to the first fixed potential otherwise.

18. A 1-bit memory storage element of claims 14 or claim 17 where the storage element is comprised of:
- a first inverter;
- a second inverter;
- a transistor;
- where the output of the said first inverter is coupled to the input of the said second inverter;
- the output of the said second inverter is coupled to the input of the said first inverter;
- the drain of the said transistor is coupled to the input of the said second inverter;
- the gate terminal of said transistor is the control toggle port of the storage element;
- the source of the said transistor is coupled to the first fixed potential;
- where the output of the second inverter is the input and output of the storage element.

19. A means to assign a unique address to each layer of stacked electronic circuitry comprising:
- a combinational or sequential function generator that operates on an input to produce an output;
- a 2-1 selector;
- a plurality of connectors of claim 7;
- a boundary detector of claim 12;
- where the control input of the selector is coupled to the output of the boundary detector and where an assert of the boundary detector will select the second input of the selector and where a no assert will select the first input of the selector;
- the second input of the selector is coupled to a first fixed potential;
- the output of the selector is coupled to the input of the function generator;
- the output of the function generator is coupled to the terminators of the connectors;
- the first input of the selector is coupled to the vertical conductors of the connectors;
- where the circuits are implemented identically on each layer and;
- where the output of the selector is the unique address of the circuit layer.

20. A means to assign a unique address to each layer of electronic circuitry as in claim 19, where the addresses are uniquely assigned and each subsequent layer is given a unique address ID using precomputation means; comprising:
- a N-bit 2-1 multiplexer, where N is greater than or equal to $\log_2(\text{layers})$;
- a N-bit combinational logic block, where N is greater than or equal to $\log_2(\text{layers})$;
- a plurality of N connectors as in claim 7, where N is greater than or equal to the $\log_2(\text{layers})$;
- a boundary detector of claim 12;
- where the control input of the multiplexer is coupled to the output of the boundary detector and where an assert of the boundary detector will select the second input of the multiplexer and where a no assert will select the first input of the multiplexer;
- the second inputs of the multiplexer are coupled to a first fixed potential;
- the outputs of the multiplexer are coupled to the first inputs of the combinational logic block;
- the outputs of the combination logic block are coupled to one of the terminators of the connectors of claim 7, where each output of the combinational logic block is coupled to a separate connector;
- the first inputs of the multiplexer are coupled to the other terminal of the connectors of claim 7 where each input is coupled to a separate connector;
- where the circuits are implemented identically on each layer and;
- where the outputs of the multiplexer is the unique address for the circuit layer.

21. A means to assign a unique address to each layer of electronic circuitry as in claim 19, where the addresses are uniquely assigned and each subsequent layer is given a unique address ID using precomputation means; comprising:
- a first plurality of N three-state drivers, where N is greater than or equal to $\log_2(\text{layers})$;
- a second plurality of N three-state drivers, where N is greater than or equal to $\log_2(\text{layers})$;
- a N-bit combinational logic block, where N is greater than or equal to $\log_2(\text{layers})$;
- a plurality of N connectors as in claim 7, where N is greater than or equal to the $\log_2(\text{layers})$;
- a boundary detector of claim 12;
- where the control input of both pluralities of three-state drivers are coupled to the output of the boundary detector and where an assert of the boundary detector will select the second plurality of three-state drivers and where a no assert will select the first plurality of three-state drivers;
- the inputs to the second plurality of three-state drivers are coupled to a first fixed potential;
- the outputs of the first and second pluralities of three-state drivers are coupled together and coupled to the first inputs of the combinational logic block;
- the outputs of the combinational logic block are coupled to one of the terminals of of the connectors of claim 7 where each output of the combinational logic block is coupled to a separate connector;
- the inputs to the first plurality of three-state drivers are coupled to the other terminal of the connectors of claim 7 where each input is coupled to a separate connector;
- where the circuits are implemented identically on each layer and;
- where the outputs of the first and second pluralities of three-state drivers is the unique address of the circuit layer.

22. A means to select one layer within a stack of electronic circuitry comprising:
- an externally supplied input address;
- a unique address for the circuit layer;
- a two-input N-bit equals comparator with a match output, where N is greater than or equal to $\log_2(\text{layers})$;
- a plurality of N connectors as in claim 7, where N is greater than or equal to $\log_2(\text{layers})$;
- where the unique address for the circuit layer is coupled to the first input bits of the equals comparator;
- the terminators and the vertical conductors of each connector are coupled together;
- the input address is coupled to the connectors, where a separate connector exists for each bit of the input address;
- the connectors, one for each bit of the input address, are coupled to the second input bits of the equals comparator;
- where the circuits are implemented identically on each layer and;
- the match output of the comparator will be asserted if the input address matches the unique circuit layer address and will not be asserted otherwise.

23. A method for fast address resolution of stacked electronic circuit layers using precomputation means allowing for input addresses to be immediately driven comprising:
    a means to assign a unique address to each layer of electronic circuitry as in claim 19;
    a means to select one layer of electronic circuitry as in claim 22.

24. A means for communicating data between storage elements on one stacked electronic circuit layer to the next storage elements on an adjacent stacked circuit layer using the connector in claim 7.

25. The storage elements of claim 24 where the storage elements are registers that sample data using a clock signal.

26. The storage elements on one stacked electronic circuit layer of claim 24, where a path exists between a separate first storage element to a separate last storage element on the same circuit layer.

27. The first and last storage elements of claim 26 where additional storage elements are arranged contiguously between the first and last storage elements.

28. The first and last storage elements of claim 26 where combinational logic can exist between the first and last storage elements on a circuit layer.

29. The combinational logic of claim 28 where additional storage elements can further segment the combinational logic and divide it into many stages.

30. The storage elements of claim 24 where the first storage element of circuit layer 'X' couples to the last storage element of circuit layer 'X−1' and the last storage element of circuit layer 'X' couples to the first storage element of circuit layer 'X+1'.

31. A means for communicating data between storage elements on one stacked circuit layer to the next storage elements on an adjacent stacked circuit layer of claim 24; comprising of:
    an external data input;
    an external clock input;
    an external data output;
    a 2-1 selector;
    a 1-2 selector;
    a first connector of claim 7;
    a second connector of claim 7;
    a third connector of claim 7;
    a first boundary detector of claim 12;
    a second boundary detector of claim 12;
    a block of sequential logic containing one or more storage elements with one primary input, one primary output and one clock input;
    where the circuits are implemented identically on each layer and;
    the control input of the 2-1 selector is coupled to the first boundary detector;
    the 2-1 selector sources data from the external data input when the first boundary detector is asserted and sources data from one of the terminals of the first connector when the first boundary detector is not asserted;
    the output of the 2-1 selector is coupled to the input of the sequential logic block;
    the output of the sequential logic block is coupled to the input of the 1-2 selector;
    the control input of the 1-2 selector is coupled to the second boundary detector;
    the 1-2 selector sources data to the terminators of the second connector when the second boundary detector is asserted and sources data to other terminal of the first connector when the second boundary detector is not asserted;
    the vertical conductors and the terminators of the second connector are coupled together;
    the external data output is coupled to the terminators of the second connector;
    the vertical conductors and the terminators of the third connector are coupled together;
    the external clock input is coupled to the terminators of the third connector;
    the vertical conductors of the third connector are coupled to the clock input of the sequential logic block.

32. A means for communicating data between storage elements on one stacked circuit layer to the next storage elements on an adjacent stacked circuit layer of claim 31; comprising of:
    an external data input;
    an external clock input;
    an external data output;
    a first three-state buffer with a control signal input where an assert of the control signal will connect the input to the output while a no assert will output high impedance;
    a second three-state buffer with a control signal input where an assert of the control signal will connect the input to the output while a no assert will output high impedance;
    a first connector of claim 7;
    a second connector of claim 7;
    a third connector of claim 7;
    a first boundary detector of claim 12;
    a second boundary detector of claim 12;
    a block of sequential logic containing one or more storage elements with one primary input, one primary output and one clock input;
    where the circuits are implemented identically on each layer and;
    the input of the first three-state buffer is coupled to the external data input;
    the control signal of the first three-state buffer is coupled to the first boundary detector;
    the output of the first three-state buffer is coupled to the primary input of the sequential logic block;
    the input of the sequential logic block is also coupled to one of the terminals of the first connector;
    the output of the sequential logic block is coupled to the other terminal of the first connector;
    the output of the sequential logic block is also coupled to the input of the second three-state buffer;
    the control input of the second three-state buffer is coupled to the second boundary detector;
    the output of the second three-state buffer is coupled to the terminators of the second connector;
    the vertical conductors and the terminators of the second connector are coupled together;
    the external data output is coupled to the terminators of the second connector;
    the vertical conductors and the terminators of the third connector are coupled together;
    the external clock input is coupled to the terminators of the third connector;
    the vertical conductors of the third connector are coupled to the clock input of the sequential logic block.

33. A means for communicating data between storage elements on one stacked circuit layer to the next storage elements on an adjacent stacked circuit layer of claim 31; comprising of:
    an external data input;
    an external clock input;

an external data output;

a 2-1 multiplexer with a control input that when asserted will couple the second input to the output and when not asserted will couple the first input to the output;

a 1-2 demultiplexer with a control input that when asserted will couple the input to the second output and when not asserted will couple the input to the first output;

a first connector of claim 7;

a second connector of claim 7;

a third connector of claim 7;

a first boundary detector of claim 12;

a second boundary detector of claim 12;

a block of sequential logic containing one or more storage elements with one primary input, one primary output and one clock input;

where the circuits are implemented identically on each layer and;

the control input of the 2-1 multiplexer is coupled to the first boundary detector;

the first input of the 2-1 multiplexer is coupled to one of the terminals of the first connector;

the second input of the 2-1 multiplexer is coupled to the external data input;

the output of the 2-1 multiplexer is coupled to the input of the sequential logic block;

the output of the sequential logic block is coupled to the input of the 1-2 demultiplexer;

the control input of the 1-2 demultiplexer is coupled to the second boundary detector;

the first output of the 1-2 demultiplexer is coupled to the other terminal of the first connector;

the second output of the 1-2 demultiplexer is coupled to the terminators of the second connector;

the vertical conductors and the terminators of the second connector are coupled together;

the external data output is coupled to the terminators of the second connector;

the vertical conductors and the terminators of the third connector are coupled together;

the external clock input is coupled to the terminators of the third connector;

the vertical conductors of the third connector are coupled to the clock input of the sequential logic block.

34. A connector for coupling together electrical signals on adjacent stacked layers of electronic circuitry comprising:

a vertical conductor with more than two electrically-connected terminators placed symmetrically around the vertical conductor;

the said conductive terminators are offset from the vertical conductor whereby one of the said terminators electrically couples to a vertical conductor on an adjacent layer.

35. The connector of claim 34 where the connector is used as one element of an electrically-connected array of such elements;

thus providing a high-density, low resistance and high current carrying inter-connection between adjacent circuit layers.

36. The connectors in claim 34 with four terminators placed symmetrically around a vertical conductor where the connectors can be rotated in 90° increments and maintain same signal connectivity between two adjacent dies.

37. The connectors in claim 36 embedded in component cells from a standard cell library;

where the orientation of the cells can be arbitrarily changed in 90° increments by computer-aided-design tools used for placement and routing.

38. The connectors in claim 36 embedded in Input/Output cells and Input/Output bonding pads;

where the I/O cells and I/O pads may have to be rotated in increments of 90°.

39. A connector for coupling together electrical signals on adjacent stacked layers of electronic circuitry comprising:

a vertical conductor with two or more electrically-connected terminators placed asymmetrically around the vertical conductor;

the said conductive terminators are offset from the vertical conductor whereby one of the said terminators electrically couples to a vertical conductor on an adjacent layer.

40. An apparatus for detecting the boundary layers in a stack of a plurality of layers of electronic circuitry;

and where vertical conductors couple together electrical signals on adjacent stacked layers of electronic circuitry comprising one or more vertical conductors and one or more terminators that surround each vertical conductor whereby a terminator electrically couples to the vertical conductor on an adjacent layer;

and where the boundary layers are identified by the absence of an adjacent layer asserting an electrical signal;

and where the boundary layers are identified without the use of an external signal coupled to the stack of layers.

41. A connector for coupling together electrical signals on adjacent stacked layers of electronic circuitry comprising:

a vertical conductor located between two electrically-connected terminators;

the said conductive terminators are offset from the vertical conductor whereby one of the said terminators electrically couples to a vertical conductor on an adjacent layer.

42. The connector of claim 41 where the connector is used as one element of an electrically-connected array of such elements;

thus providing a high-density, low resistance and high current carrying interconnection between adjacent circuit layers.

43. A vertical conductor of claim 41 where the vertical conductors are interdie vias formed through the thickness of a wafer.

44. A connector of claim 41 where the vertical conductors are coaxial lines that extend through the thickness of the various semiconductor dies and where the terminators are micro bumps on the semiconductor dies that can be bonded to coaxial lines.

45. A connector of claim 41 where the vertical conductors are interconnection members such as solder mounds, wire bonds, or embedded wiring and where the terminators are contact locations that can couple to solder mounds, wire bonds, or embedded wiring.

46. An apparatus where adjacent layers of electronic circuitry are offset in multiple directions by the distance between a vertical conductor and a terminator of claim 41;

and where the direction of the offset is in a direction from the vertical conductors towards one of the terminators;

and where adjacent layers in the stack are thus offset to align with one of the terminators on the sides of the vertical conductors;

and where the alignment is only constrained by the coupling of vertical conductors and terminators between adjacent layers.

47. A boundary detector for uniquely identifying the boundary layers in a stack of electronic circuitry layers that use the connector in claim 41
 where the boundary layers are the extreme layers of the stack of layers and where the boundary layers are identified by an assert or no assert of an electrical signal;
 and where each boundary detection circuit is implemented identically on each layer.

48. A passive second boundary layer detector of claim 47 requiring no external control signals, comprising:
 a connector of claim 41;
 a resistor;
 the terminators are coupled to each other and to the first terminal of the resistor;
 the vertical conductor is coupled to a fixed first potential;
 the second terminal of the resistor is coupled to a second fixed potential;
 where the first terminal of the resistor is the output of the boundary detector and is asserted to the second fixed potential if the layer is the second boundary layer and is asserted to the first fixed potential otherwise.

49. A means to assign a unique address to each layer of stacked electronic circuitry comprising:
 a combinational or sequential function generator that operates on an input to produce an output;
 a 2-1 selector;
 a plurality of connectors of claim 41;
 a boundary detector of claim 47;
 where the control input of the selector is coupled to the output of the boundary detector and where an assert of the boundary detector will select the second input of the selector and where a no assert will select the first input of the selector;
 the second input of the selector is coupled to a first fixed potential;
 the output of the selector is coupled to the input of the function generator;
 the output of the function generator is coupled to the terminators of the connectors;
 the first input of the selector is coupled to the vertical conductors of the connectors;
 where the circuits are implemented identically on each layer and;
 where the output of the selector is the unique address of the circuit layer.

50. A means to assign a unique address to each layer of electronic circuitry as in claim 49, where the addresses are uniquely assigned and each subsequent layer is given a unique address ID using precomputation means; comprising:
 a N-bit 2-1 multiplexer, where N is greater than or equal to $\log_2(layers)$;
 a N-bit combinational logic block, where N is greater than or equal to $\log_2(layers)$;
 a plurality of N connectors as in claim 41, where N is greater than or equal to the $\log_2(layers)$;
 a boundary detector of claim 47;
 where the control input of the multiplexer is coupled to the output of the boundary detector and where an assert of the boundary detector will select the second input of the multiplexer and where a no assert will select the first input of the multiplexer;
 the second inputs of the multiplexer are coupled to a first fixed potential;
 the outputs of the multiplexer are coupled to the first inputs of the combinational logic block;
 the outputs of the combination logic block are coupled to one of the terminals of the connectors of claim 41, where each output of the combinational logic block is coupled to a separate connector;
 the first inputs of the multiplexer are coupled to the other terminal of the connectors of claim 41 where each input is coupled to a separate connector;
 where the circuits are implemented identically on each layer and;
 where the outputs of the multiplexer is the unique address for the circuit layer.

51. A means to assign a unique address to each layer of electronic circuitry as in claim 49, where the addresses are uniquely assigned and each subsequent layer is given a unique address ID using precomputation means; comprising:
 a first plurality of N three-state drivers, where N is greater than or equal to $\log_2(layers)$;
 a second plurality of N three-state drivers, where N is greater than or equal to $\log_2(layers)$;
 a N-bit combinational logic block, where N is greater than or equal to $\log_2(layers)$;
 a plurality of N connectors as in claim 41, where N is greater than or equal to the $\log_2 layers$
 a boundary detector of claim 47;
 where the control input of both pluralities of three-state drivers are coupled to the output of the boundary detector and where an assert of the boundary detector will select the second plurality of three-state drivers and where a no assert will select the first plurality of three-state drivers;
 the inputs to the second plurality of three-state drivers are coupled to a first fixed potential;
 the outputs of the first and second pluralities of three-state drivers are coupled together and coupled to the first inputs of the combinational logic block;
 the outputs of the combinational logic block are coupled to one of the terminals of of the connectors of claim 41 where each output of the combinational logic block is coupled to a separate connector;
 the inputs to the first plurality of three-state drivers are coupled to the other terminal of the connectors of claim 41 where each input is coupled to a separate connector;
 where the circuits are implemented identically on each layer and;
 where the outputs of the first and second pluralities of three-state drivers is the unique address of the circuit layer.

52. A passive first boundary layer detector of claim 47 requiring no external control signals, comprising:
 a connector of claim 41;
 a resistor;
 the terminators are coupled to a first fixed potential;
 the vertical conductors are coupled to the first terminal of the resistor;
 the second terminal of the resistor is coupled to a second fixed potential;
 where the first terminal of the resistor is the output of the boundary detector and is asserted to the second fixed potential if the layer is the first boundary layer and is asserted to the first fixed potential otherwise.

53. A resistor of claim 52 or claim 48 where the resistor is an always on weak drive transistor of wide channel length.

54. An active first boundary layer detector of claim 47 that does not dissipate static power and requires one external control signal, comprising:
 a connector of claim 41;

a 1-bit memory storage element with an output that tracks the value of its input when the clock is asserted and holds the previous value of the input otherwise;

where the terminators are coupled to a first fixed potential;

the vertical conductors are coupled to the input of the storage element;

the output of the storage element is coupled to the input of the storage element;

the clock input is asserted at all times;

where the storage element contains a control port that unconditionally toggles the output of the storage element to a second fixed potential;

where the output of the storage element is the output of the boundary detector and is asserted to the second fixed potential if the layer is the first boundary layer and is asserted to the first fixed potential otherwise.

55. An active second boundary layer detector of claim 47 that does not dissipate static power and requires one external control signal, comprising:

a connector of claim 41;

a 1-bit memory storage element with an output that tracks the value of its input when the clock is asserted and holds the previous value of the input otherwise;

where the terminators are coupled to each other and to the input of the storage element;

the vertical conductor is coupled to a first fixed potential;

the output of the storage element is coupled to the input of the storage element;

the clock input is asserted at all times;

where the storage element contains a control port that unconditionally toggles the output of the storage element to a second fixed potential;

where the output of the storage element is the output of the boundary detector and is asserted to the second fixed potential if the layer is the second boundary layer and is asserted to the first fixed potential otherwise.

56. A 1-bit memory storage element of claim 54 or claim 55 where the storage element is comprised of:

a first inverter;

a second inverter;

a transistor;

where the output of the said first inverter is coupled to the input of the said second inverter;

the output of the said second inverter is coupled to the input of the said first inverter;

the drain of the said transistor is coupled to the input of the said second inverter;

the gate terminal of said transistor is the control toggle port of the storage element;

the source of the said transistor is coupled to the first fixed potential;

where the output of the second inverter is the input and output of the storage element.

57. A means to select one layer within a stack of electronic circuitry comprising:

an externally supplied input address;

a unique address for the circuit layer;

a two-input N-bit equals comparator with a match output, where N is greater than or equal to $\log_2(\text{layers})$;

a plurality of N connectors as in claim 41, where N is greater than or equal to $\log_2\text{layers}$;

where the unique address for the circuit layer is coupled to the first input bits of the equals comparator;

the terminators and the vertical conductors of each connector are coupled together;

the input address is coupled to the connectors, where a separate connector exists for each bit of the input address;

the connectors, one for each bit of the input address, are coupled to the second input bits of the equals comparator;

where the circuits are implemented identically on each layer and;

the match output of the comparator will be asserted if the input address matches the unique circuit layer address and will not be asserted otherwise.

58. A method for fast address resolution of stacked electronic circuit layers using precomputation means allowing for input addresses to be immediately driven comprising:

a means to assign a unique address to each layer of electronic circuitry as in claim 49;

a means to select one layer of electronic circuitry as in claim 57.

59. A means for communicating data between storage elements on one stacked electronic circuit layer to the next storage elements on an adjacent stacked circuit layer using the connector in claim 41.

60. The storage elements of claim 59 where the storage elements are registers that sample data using a clock signal.

61. The storage elements on one stacked electronic circuit layer of claim 59, where a path exists between a separate first storage element to a separate last storage element on the same circuit layer.

62. The first and last storage elements of claim 61 where additional storage elements are arranged contiguously between the first and last storage elements.

63. The first and last storage elements of claim 61 where combinational logic can exist between the first and last storage elements on a circuit layer.

64. The combinational logic of claim 63 where additional storage elements can further segment the combinational logic and divide it into many stages.

65. The storage elements of claim 59 where the first storage element of circuit layer 'X' couples to the last storage element of circuit layer 'X−1' and the last storage element of circuit layer 'X' couples to the first storage element of circuit layer 'X+1'.

66. A means for communicating data between storage elements on one stacked circuit layer to the next storage elements on an adjacent stacked circuit layer of claim 59; comprising:

an external data input;

an external clock input;

an external data output;

a 2-1 selector;

a 1-2 selector;

a first connector of claim 41;

a second connector of claim 41 a third connector of claim 41;

a first boundary detector of claim 47;

a second boundary detector of claim 47;

a block of sequential logic containing one or more storage elements with one primary input, one primary output and one clock input;

where the circuits are implemented identically on each layer and;

the control input of the 2-1 selector is coupled to the first boundary detector; the 2-1 selector sources data from the external data input when the first boundary detector is asserted and sources data from one of the terminals of the first connector when the first boundary detector is not asserted;

the output of the 2-1 selector is coupled to the input of the sequential logic block;

the output of the sequential logic block is coupled to the input of the 1-2 selector;

the control input of the 1-2 selector is coupled to the second boundary detector;

the 1-2 selector sources data to the terminators of the second connector when the second boundary detector is asserted and sources data to other terminal of the first connector when the second boundary detector is not asserted;

the vertical conductors and the terminators of the second connector are coupled together;

the external data output is coupled to the terminators of the second connector;

the vertical conductors and the terminators of the third connector are coupled together;

the external clock input is coupled to the terminators of the third connector;

the vertical conductors of the third connector are coupled to the clock input of the sequential logic block.

67. A means for communicating data between storage elements on one stacked circuit layer to the next storage elements on an adjacent stacked circuit layer of claim 66; comprising of:

an external data input;

an external clock input;

an external data output;

a first three-state buffer with a control signal input where an assert of the control signal will connect the input to the output while a no assert will output high impedance;

a second three-state buffer with a control signal input where an assert of the control signal will connect the input to the output while a no assert will output high impedance;

a first connector of claim 41;

a second connector of claim 41;

a third connector of claim 41;

a first boundary detector of claim 47;

a second boundary detector of claim 47;

a block of sequential logic containing one or more storage elements with one primary input, one primary output and one clock input;

where the circuits are implemented identically on each layer and;

the input of the first three-state buffer is coupled to the external data input;

the control signal of the first three-state buffer is coupled to the first boundary detector;

the output of the first three-state buffer is coupled to the primary input of the sequential logic block;

the input of the sequential logic block is also coupled to one of the terminals of the first connector;

the output of the sequential logic block is coupled to the other terminal of the first connector;

the output of the sequential logic block is also coupled to the input of the second three-state buffer;

the control input of the second three-state buffer is coupled to the second boundary detector;

the output of the second three-state buffer is coupled to the terminators of the second connector;

the vertical conductors and the terminators of the second connector are coupled together;

the external data output is coupled to the terminators of the second connector;

the vertical conductors and the terminators of the third connector are coupled together;

the external clock input is coupled to the terminators of the third connector;

the vertical conductors of the third connector are coupled to the clock input of the sequential logic block.

68. A means for communicating data between storage elements on one stacked circuit layer to the next storage elements on an adjacent stacked circuit layer of claim 66; comprising of:

an external data input;

an external clock input;

an external data output;

a 2-1 multiplexer with a control input that when asserted will couple the second input to the output and when not asserted will couple the first input to the output;

a 1-2 demultiplexer with a control input that when asserted will couple the input to the second output and when not asserted will couple the input to the first output;

a first connector of claim 41;

a second connector of claim 41;

a third connector of claim 41;

a first boundary detector of claim 47;

a second boundary detector of claim 47;

a block of sequential logic containing one or more storage elements with one primary input, one primary output and one clock input;

where the circuits are implemented identically on each layer and;

the control input of the 2-1 multiplexer is coupled to the first boundary detector;

the first input of the 2-1 multiplexer is coupled to one of the terminals of the first connector;

the second input of the 2-1 multiplexer is coupled to the external data input;

the output of the 2-1 multiplexer is coupled to the input of the sequential logic block;

the output of the sequential logic block is coupled to the input of the 1-2 demultiplexer;

the control input of the 1-2 demultiplexer is coupled to the second boundary detector;

the first output of the 1-2 demultiplexer is coupled to the other terminal of the first connector;

the second output of the 1-2 demultiplexer is coupled to the terminators of the second connector;

the vertical conductors and the terminators of the second connector are coupled together;

the external data output is coupled to the terminators of the second connector;

the vertical conductors and the terminators of the third connector are coupled together;

the external clock input is coupled to the terminators of the third connector;

the vertical conductors of the third connector are coupled to the clock input of the sequential logic block.

* * * * *